United States Patent
Hung (10) Patent No.: US 11,217,313 B2
(45) Date of Patent: Jan. 4, 2022

(54) LOW NOISE BIT LINE CIRCUITS

(71) Applicant: MACRONIX INTERNATIONAL CO., LTD., Hsinchu (TW)

(72) Inventor: Ji-Yu Hung, Miaoli (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 17/107,692

(22) Filed: Nov. 30, 2020

(65) Prior Publication Data

US 2021/0082521 A1 Mar. 18, 2021

Related U.S. Application Data

(62) Division of application No. 16/278,026, filed on Feb. 15, 2019, now Pat. No. 10,885,986.

(51) Int. Cl.
*G11C 16/24* (2006.01)
*G11C 16/26* (2006.01)

(52) U.S. Cl.
CPC .............. *G11C 16/24* (2013.01); *G11C 16/26* (2013.01)

(58) Field of Classification Search
CPC ................................. G11C 16/24; G11C 16/26
USPC ...................................................... 365/185.25
See application file for complete search history.

(56) References Cited

U.S. PATENT DOCUMENTS

| | | | |
|---|---|---|---|
| 6,208,573 B1 | 3/2001 | Tanaka et al. | |
| 7,333,371 B2 | 2/2008 | Hosono | |
| 7,889,572 B2 | 2/2011 | Ho et al. | |
| 7,916,547 B2 | 3/2011 | Hosono | |
| 8,441,853 B2 | 5/2013 | Li | |
| 9,136,006 B2 | 9/2015 | Hung et al. | |
| 9,349,469 B2 | 5/2016 | Chen et al. | |
| 9,536,601 B2 | 1/2017 | Chen et al. | |
| 9,852,784 B2 * | 12/2017 | DeBrosse | G11C 11/1673 |
| 10,885,986 B2 | 1/2021 | Hung | |
| 2003/0214853 A1 * | 11/2003 | Hosono | G11C 16/3463 365/200 |
| 2009/0040834 A1 * | 2/2009 | Ogawa | G11C 16/26 365/185.21 |
| 2010/0172187 A1 * | 7/2010 | Dunga | G11C 16/26 365/185.21 |

* cited by examiner

*Primary Examiner* — Muna A Techane
(74) *Attorney, Agent, or Firm* — Haynes Beffel & Wolfeld LLP (57) ABSTRACT

The disclosed technology teaches a memory device with memory cells, each with a sense circuit with an input node in current flow communication, a BLC transistor, a transfer transistor, a current source transistor, and an output circuit to generate data based on a voltage on the sensing node. Also disclosed is a sensing sequence in which control circuits apply BLC voltage to the BLC transistor, transfer voltage to the transfer transistor and current control voltage to the current source transistor to provide a charging current to the BL, and to adjust the current control voltage to provide a keeping current on the BL from the current source transistor, and to apply a read voltage to a selected memory cell on the bit line. Additionally included is applying a timing signal to the output circuit to generate the data based on a voltage on the sensing node.

8 Claims, 6 Drawing Sheets

FIG. 6

LOW NOISE BIT LINE CIRCUITS

PRIORITY APPLICATION

This application is a divisional of U.S. patent application Ser. No. 16/278,026 filed 15 Feb. 2019 (now U.S. Pat. No. 10,885,986); which application is incorporated herein by reference.

BACKGROUND

Field of the Technology

The present disclosure relates to high density memory devices, in which bit line charging current used during operation of the devices is controlled.

Description of Related Art

NAND flash memory is widely adopted as a storage medium for mobile devices, solid-state disks in laptops and servers and for other data processing systems. As the data density on NAND flash memory chips has increased, page operations have become prevalent, in which large numbers of bit lines are used in parallel for access to the memory cells of a page of data. Other memory architectures also provide for parallel sensing operations using large numbers of bit lines.

The data pattern in a page read can vary widely and, as a result, the voltages on the bit lines and sensing circuits varies across the page. As the density of memory devices increases, these variations in voltages can induce noise across the page that impacts sensing margins.

It is desirable, therefore, to provide improved technology for reducing noise in high density memory.

SUMMARY

A memory device is described, comprising an array of memory cells such as a page mode NAND flash memory array, including a plurality of bit lines. A plurality of bit line circuits are coupled to the plurality of bit lines. A bit line circuit in the plurality of bit line circuits in an illustrated embodiment can include three nodes: an input node, and intermediate node and a sensing node. The input node is in current flow communication with a corresponding bit line in the plurality of bit lines. A first transistor is between the input node and the intermediate node. A second transistor is between the intermediate node and the sensing node. A third transistor is between the sensing node and a supply terminal. An output circuit is connected to the sensing node to generate a data signal based on a voltage on the sensing node.

Control circuits are coupled to the plurality of bit line circuits to control a read or sensing sequence including, in an illustrated embodiment, (1) during a first phase to apply a bit line clamp voltage to the first transistor, a transfer voltage to the second transistor and a third voltage to the third transistor to charge the sensing node; (2) during a second phase to adjust the third voltage applied to the third transistor to a keeping level, while a read voltage is applied to a selected memory cell on the bit line to discharge the sensing node toward a discharge level corresponding to a sensed memory state, the keeping level being below voltage on the sensing node by an amount to turn off the third transistor while the sensing node remains above the discharge level, and to cause the third transistor to turn on and apply a keeping current after the sensing node reaches the discharge level; and (3) during a third phase to generate the data signal based on a voltage on the sensing node after the second phase. Optionally, the control circuits can boost the sensing node to a boosted voltage during the second phase before discharging the sensing node through the memory cell.

Methods of operating a memory device are described such as can be performed according to the control circuits described herein.

Other aspects and advantages of the present invention can be seen on review of the drawings, the detailed description and the claims, which follow.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings.

DETAILED DESCRIPTION

A detailed description of embodiments of the present invention is provided with reference to the FIGS. 1-6. Sample implementations are described to illustrate the technology disclosed, not to limit its scope, which is defined by the claims. Those of ordinary skill in the art will recognize a variety of equivalent variations on the description that follows.

Figure 1:
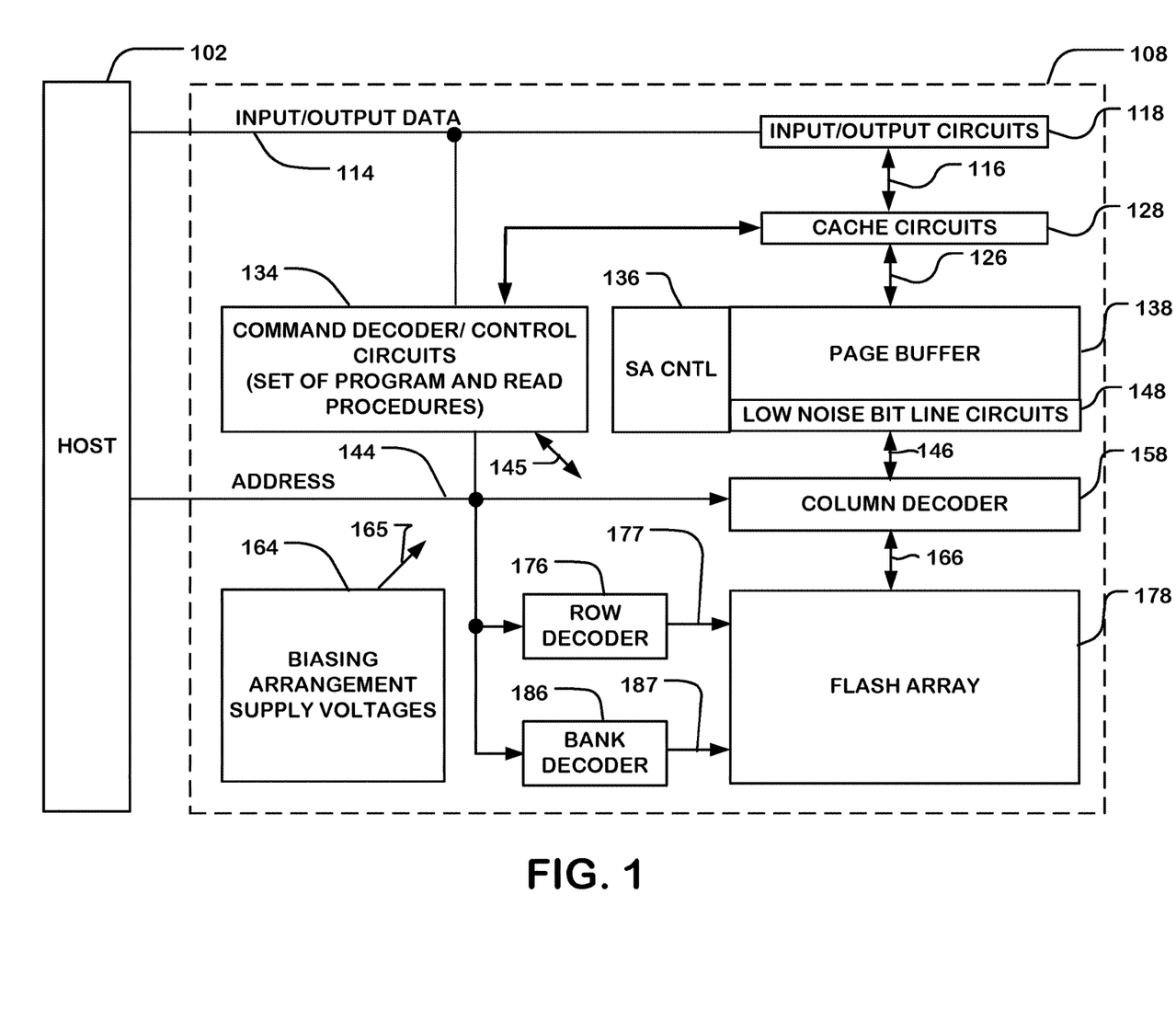
FIG. 1 is a simplified diagram of a memory system including a flash memory device implemented on an integrated circuit and a host according to one implementation of the technology disclosed.

FIG. 1 is a simplified diagram of a memory system that includes a flash memory device 108 implemented on an integrated circuit and a host 102 configured for page operations, or other operations that include reading a plurality of cells in parallel. The example memory system includes logic for page reading and programming with sense amplifiers and control circuits as described herein. In various embodiments, the memory device 108 may have single-level cells (SLC), or multiple level cells storing more than one bit per cell (e.g., MLC, TLC or XLC). The memory device can be implemented on a single integrated circuit chip, on a multichip module, or on a plurality of chips configured as suits a particular need.

The memory array 178 can be a NAND flash memory implemented using two-dimensional or three-dimensional array technology.

A row decoder 176 is coupled to a plurality of word lines 177, and arranged along rows in the memory array 178. Word line decoders are included in row decoder 176. A bank decoder 186 is coupled to a plurality of bank select lines 187 (such as SSL lines and GSL lines). A column decoder 158 is coupled to a plurality of bit lines 166 arranged along columns in the memory array 178 for reading data from and writing data to the memory array 178. A bus including address lines 144 and data lines 114 is illustrated in this example. Addresses are supplied on address lines 144 to circuits 134 implementing a command decoder and controller modules, to column decoder 158, to bank decoder 186 and to row decoder 176. In other examples, an input/output port may be used in which addresses and data may be provided on shared lines in an address/data bus. Also, serial interfaces may be deployed. In one implementation, the page buffer can be the same width as the memory array. In another implementation, column decoder 158 can decode a plurality of bit lines to select, for example, one thousand among a potential ten thousand bit lines. Different implementations can utilize various array architectures.

Page buffer circuits 138 are coupled to the column decoder 158, in this example via first data lines 146. The page buffer circuits 138 can store pages of data. The page buffer circuits 138 for the purposes of this description include low-noise bit line circuits 148, as described herein, including sensing nodes coupled in current flow communication with the bit lines in the array 178.

As described herein, the low-noise bit line circuits 148 can regulate the bit line currents and voltages generated during reading operations. Sense amplifier control circuit 136 is coupled to or part of the control circuits 134, and provides bias and timing signals to the low-noise bit line circuits for the purposes of executing sensing operations in coordination with the other circuits coupled to the memory array 178, including the row decoder 176.

Bit lines for memory arrays can comprise global bit lines (GBL) and local bit lines. Bit lines generally comprise conductors in higher patterned layers that traverse a plurality of blocks of memory cells in an array, and connect to local bit lines in the blocks via block select transistors or bank select transistors. The local bit lines are connected to the memory cells for current flow to and from the bit lines, which in turn are connected to the bit line circuits 148 and page buffer circuits 138.

In a sensing operation, sensed data from the page buffer circuits 138 are supplied via second data lines 126 to cache circuits 128, which are in turn coupled to input/output circuits 118 via data path lines 116. Also, input data is applied in this example to the cache circuits 128 on lines 116, and to the page buffer circuits 138 on lines 126, for use in support of program operations.

Input/output circuits 118 provide communication paths for the data with destinations external to the memory device 108. Input/output data and control signals are moved via data lines 114 between the input/output circuits 118, the control circuits 134 and input/output ports on the memory device 108 or other data sources internal or external to the memory device 108, such as a general purpose processor or special purpose application circuitry, or a combination of modules providing system-on-a-chip functionality supported by the memory array 178.

In the example shown in FIG. 1, control circuits 134 and sense amplifier control circuit 136 include control modules implementing a bias arrangement state machine, or machines, which controls, or control, the application of supply voltages generated or provided through the voltage supply or supplies in block 164, such as read, erase, verify and program voltages including pre-charge voltages, for a set of selectable program and read operations. Supply voltages are applied to memory device 108, as shown by arrow 165. Control circuit signals are distributed to circuits in memory device, as shown by arrow 145.

The control circuits 134 are coupled to the cache circuits 128 and the memory array 178 and other elements of the integrated circuit as needed.

The circuits 134 can include modules implemented using special-purpose logic circuitry including state machines, as known in the art. In alternative embodiments, the circuits 134 can include modules implemented using a general-purpose processor, which can be implemented on the same integrated circuit, which execute a computer program to control the operations of the memory device 108. In yet other embodiments, a combination of special-purpose logic circuitry and a general-purpose processor can be utilized for implementation of modules in circuits 134.

The flash memory array 178 can comprise floating gate memory cells or dielectric charge trapping memory cells configured to store multiple bits per cell, by the establishment of multiple program levels that correspond to amounts of charge stored, which in turn establish memory cell threshold voltages $V_T$. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 102 is coupled to the address lines 144 and data lines 114 on the memory device 108, as well as other control terminals not shown, such as chip select terminals and so on, and can provide commands or instructions to the memory device 108. In some examples, the host 102 can be coupled to the memory device using a serial bus technology, using shared address and data lines. The host 102 can comprise a general purpose processor, a special purpose processor, a processor configured as a memory controller, or other processor that uses the memory device 108. All or part of the host 102 can be implemented on the same integrated circuit as the memory.

The host 102 can include a file system or file systems that store, retrieve, and update data stored in the memory based on requests from an application program. In general, the host 102 can include programs that perform memory management functions and other functions that can produce status information for data stored in the memory, including information marking data invalid as a result of such functions. Such functions can include for example wear leveling, bad block recovery, power loss recovery, garbage collection, error correction, and so on. Also, the host 102 can include application programs, file systems, flash translation layer programs and other components that can produce status information for data stored in the memory, including information marking data invalid as a result of such functions.

In high density memory, a page can comprise hundreds or thousands of bits, and a page buffer can be connected in parallel to the corresponding hundreds or thousands of bit lines. During program operations, for example, one set of bit lines is selected to be biased for programming a particular data pattern, and a different set of bit lines is selected to be biased to inhibit programming according to the particular data pattern.

Figure 2:
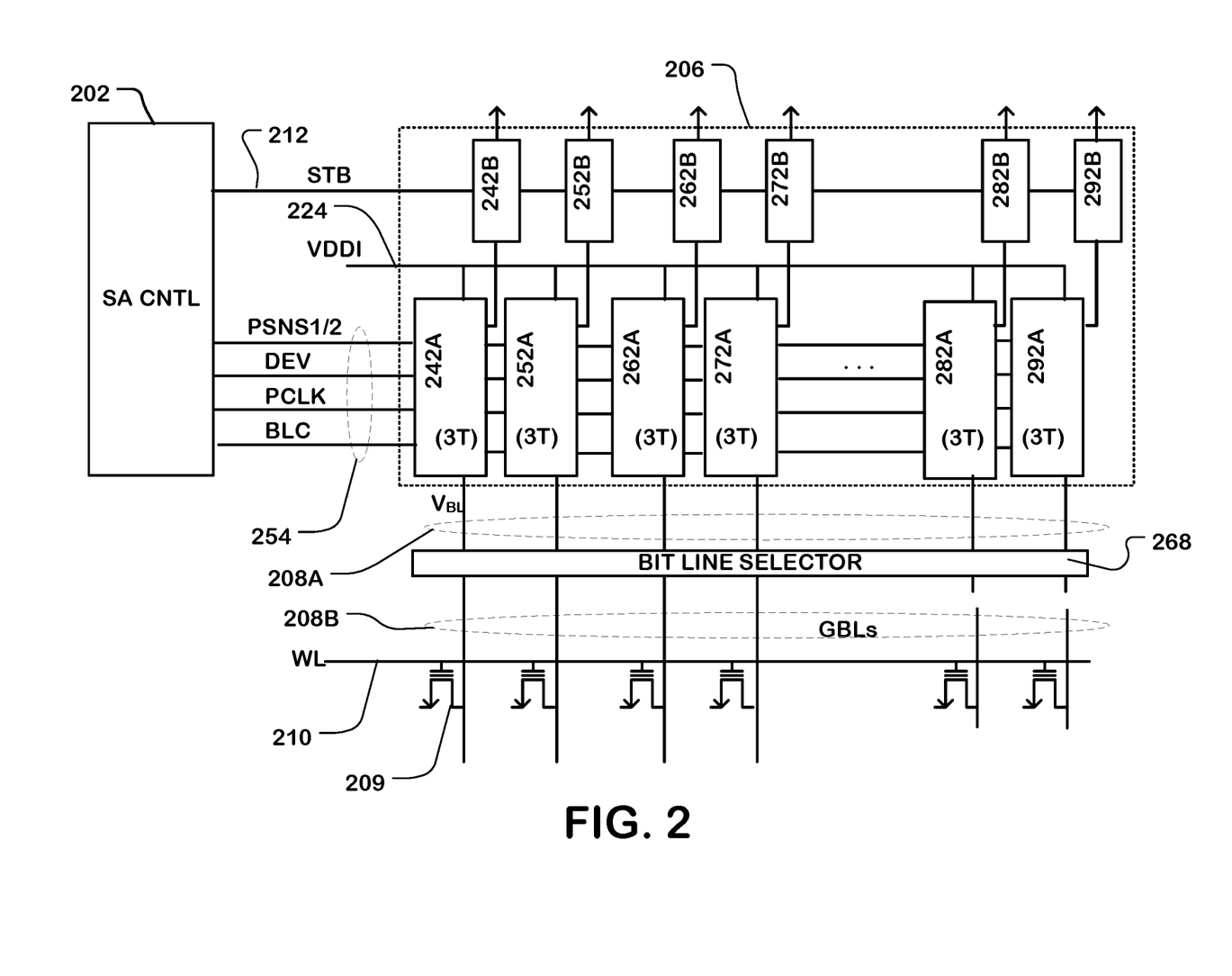
FIG. 2 is a simplified diagram of a page buffer configuration, including bit line circuits according to an implementation of the technology disclosed.

FIG. 2 is a simplified diagram of a plurality of bit line circuits 206 which can be used in a circuit like that of FIG.

1. The plurality of bit line circuits is coupled to a plurality of data lines 208A, which are in turn coupled through a bit line selector 268 for current flow communication with a plurality of bit lines 208B, where the bit lines can be global bit lines that are selectively connected to local bit lines according to decoding operations and the like in some implementations. In some embodiments, the data lines are directly connected to, or part of, the bit lines. The plurality of bit lines 208B are coupled according to the particular memory array architecture to memory cells (e.g. 209). Memory cells in a row in the array are coupled to a word line 210, which can be shared by an entire page of memory cells. Sense amplifier control circuit 202 generates control signals and bias signals that are applied to bit line circuits in the plurality of bit line circuits 206 for the purposes of a variety of operations of the memory, the variety of operations including sensing operations such as read operations, in some types of memory including flash memory, and verify operations in support of program and erase.

In the embodiment represented by FIG. 2, bit line circuits in the plurality of bit line circuits 206 include respective sense modules 242A, 252A, 262A, 272A, . . . 282A, 292A and output modules 242B, 252B, 262B, 272B, . . . 282B, 292B. The sense modules include respective sense nodes at which a voltage is developed during a sensing operation in response to the word line voltage applied to the selected cells on the corresponding bit lines. The output modules generate a data signal in response to the voltage on the sense nodes that is applied for example to a latch or other data storage element in a page buffer.

In an embodiment described herein, the sense modules can have three nodes and can be implemented using three transistors (3T). The output modules in an embodiment described herein can be implemented using two transistors.

The sense amplifier control circuit 202 applies a first set of control signals (BLC, PCLK, DEV, PSNS1/2) 254 to the sense modules and a second set of control signals (STB) 212 to the output modules. A supply voltage is supplied on line 224 to the sense modules. Operation of the control signals as described below.

Figures 3A, 3B:
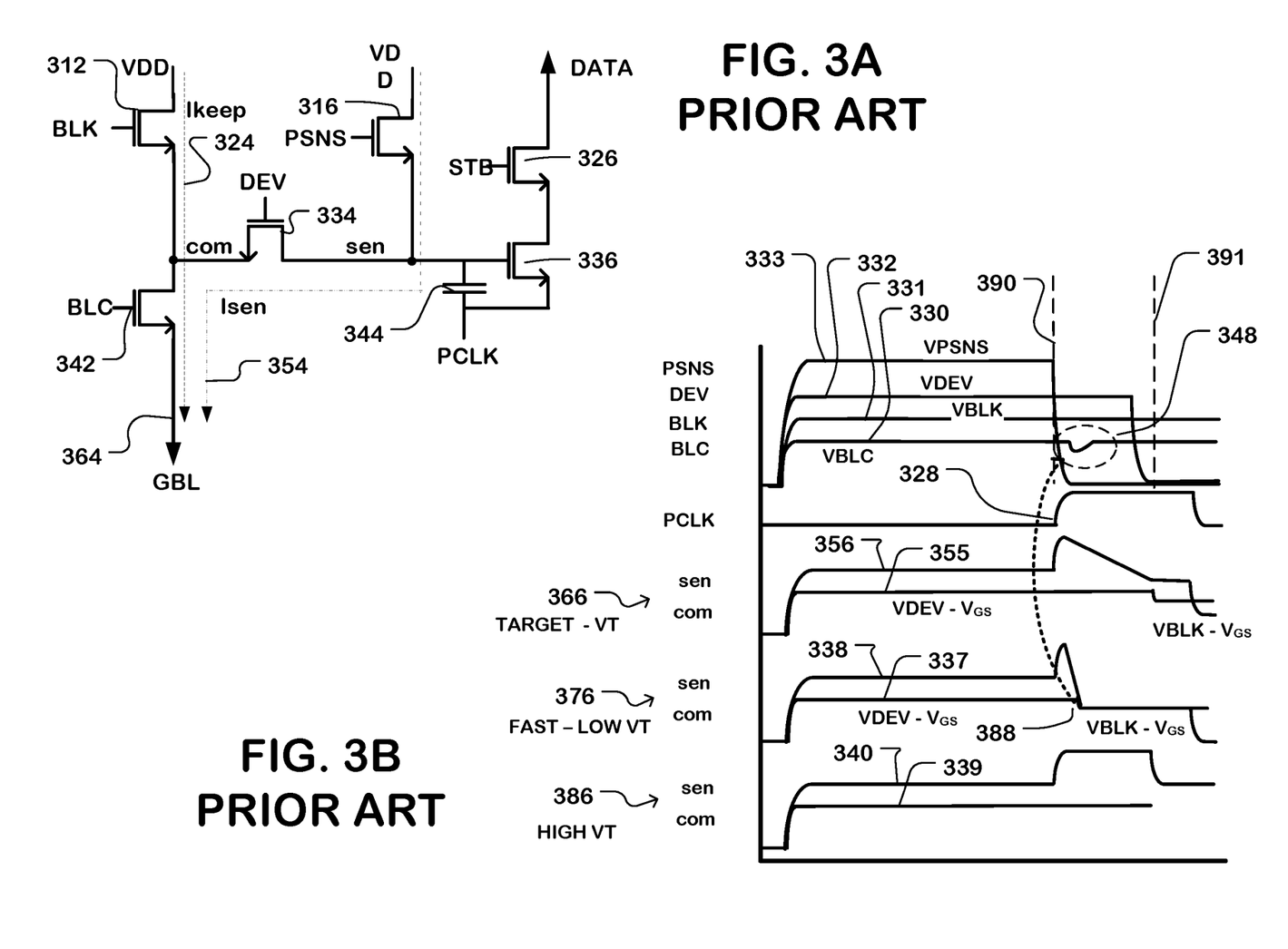
FIGS. 3A and 3B illustrate a prior art bit line circuit and timing diagram.

FIG. 3A illustrates a prior art sense module. The circuit is coupled to a bit line 364 (via a data line in some examples), and provides output data.

A first transistor 342 has a gate connected to the BLC signal, a source/drain terminal connected to the bit line 364, and a source/drain terminal connected to an intermediate node "com". A second transistor 334 has a source/drain terminal connected to the intermediate node "com", and a source/drain terminal connected to the sensing node "sen." A gate of the second transistor 334 is connected to the control signal DEV. A third transistor 316 has a source/drain terminal connected to the sensing node "sen", and a source/drain terminal connected to the supply voltage VDD, either directly or through intervening circuits, and a gate connected to the control signal PSNS. A fourth transistor 312 has a gate connected to the control signal BLK, a source/drain terminal connected to the intermediate node "com", and a source/drain terminal connected to the supply voltage VDD, either directly or through intervening circuits.

The control signal PCLK is capacitively coupled to the sensing node "sen" via capacitor 344 in this example.

An output circuit includes a fifth transistor 336 and a sixth transistor 326. The fifth transistor 336 has its gate connected to the sensing node "sen", a first source/drain terminal connected to the PCLK signal, and a second source/drain terminal. The sixth transistor 326 in the output circuit has a first source/drain terminal connected to the second source/drain terminal of the fifth transistor 336, and its gate connected to the control signal STB. The second source/drain terminal of the sixth transistor 326 supplies a data signal DATA as output.

The BLC signal is applied to the gates of transistors (first transistor 342) in a plurality of the sense modules, which are configured as bit line clamps to hold a bit line voltage VBL on the bit lines during a sensing operation. This BLC signal can be shared on a common conductor to a large number of bit line clamp transistors. Fluctuation 348 in the BLC signal can cause corresponding fluctuation in the bit line voltage VBL across the plurality of bit lines being accessed for a given sensing operation. This fluctuation contributes to noise in the sensing operation, limiting operational margins of the sensing circuitry.

Also, the transistors configured as bit line clamps can be susceptible to channel length modulation as a result of variations in the magnitude of their source-to-drain voltages, such as might be caused by fluctuations of the intermediate node. This channel length modulation can also cause fluctuation in the bit line voltage VBL that contributes to noise in the sensing operation.

FIG. 3B is a timing diagram referred to for description of a sensing operation for the prior art sense module of FIG. 3A. The sensing operation includes a pre-charge interval (before time 390) and a developing phase (between time 390 and time 391). At or near the end of the developing phase, in a third phase, the STB signal is asserted (not shown) to output the data.

In the timing diagram, voltages for the control signals BLC, BLK, DEV and PSNS shown in the circuit of FIG. 3A are shown on traces 330, 331, 332, 333, respectively. At the beginning of the pre-charge interval, all four of these control voltages are moved to operating levels. BLC is set at a voltage that will clamp the bit line voltage VBL at a level of about BLC−VGS. BLK is set at a voltage about BLC+ΔV1, sufficient to maintain the intermediate node "com" at a level above BLC. DEV is set at a level about BLK+ΔV2, sufficient to operate to drive the intermediate node "com" at a level which will turn off the fourth transistor 312, allowing pre-charge current to flow through the second transistor 334. PSNS is set at a level that determines the pre-charge voltage of the sensing node, and can pass current to the bit line sufficient to maintain the clamping operation of the first transistor 342. During the operation, the voltage on the sensing node can fall below the level necessary to sustain the intermediate node "com" at VDEV−VGS. At that point, the fourth transistor 312 turns on, providing the current Ikeep 324 to keep the intermediate node "com" at a voltage at least as high as BLK−VGS.

The PCLK signal is pulsed at the beginning of the developing phase, at the same time that the PSNS voltage is dropped, as seen on trace 328. This results in boosting the sensing node "sen", by capacitive boosting.

In the timing diagram, there are three versions illustrated for the voltage at the sensing node "sen" and at the intermediate node "com". The uppermost timing diagram version 366, including traces 355, 356, represents the voltages when sensing a low threshold memory cell having a threshold within a narrow range of the target threshold voltage $V_T$. The middle timing diagram version 376 on traces 337, 338, represents the voltages when sensing a low threshold memory cell having a threshold causing it to operate as a "fast" cell, where the threshold may be lower than the preferred target $V_T$. The lower timing diagram version 386, on traces 339, 340, represents the voltages when sensing a high threshold memory cell, where the threshold may be higher than the preferred target $V_T$.

At the beginning of the developing phase, when the word line voltage is applied to the selected word line and memory cells, the PSNS signal is dropped to ground while the other control signals DEV, BLK and BLC are held constant. As a result of the fall of PSNS below the sensing node "sen", the third transistor 316 turns off, isolating the sensing node. At that time, the PCLK, as seen on trace 328, is pulsed which boosts the sensing node by capacitive coupling. This boosting occurs at about time 390 in all three timing diagram versions (uppermost) 366, (middle) 376, (lower) 386. Thereafter, the selected memory cell either discharges the sensing node as in the uppermost timing diagram version 366, or does not discharge the sensing node as in the lower timing diagram version 386, depending on its threshold voltage $V_T$ or data state.

At the end of the discharge interval, the fourth transistor 312 may turn on to keep the intermediate node "com" at a level sufficient to maintain the clamping action of the first transistor 342. This causes a drop in the voltage on the intermediate node "com" of about ΔV2. Also, the STB signal is asserted at the end of the discharge interval. Depending on the voltage at the sensing node, the fifth transistor 336 is either on (no discharge of the sensing node) or off (sensing node discharged), thereby transferring the data out of the sense module.

For the uppermost timing diagram version 366 in which the selected memory cell has a low threshold within a narrow range of the target, the voltage on the sensing node drops relatively gradually until the end of the developing phase at about time 391.

For the lower timing diagram version 386, in which the selected memory cell has a high threshold representing a different memory state, the voltage on the sensing node is not discharged, and remains constant.

When the selected memory cell is a fast cell, such as in the middle timing diagram version 376, the sensing node can be discharged rapidly. This can result in the sensing node voltage on trace 337 falling below the voltage necessary to sustain the intermediate node "com" at $V_{DEV}$–$V_{GS}$, much earlier than in the case of the normal cell, and can cause the fourth transistor 312 to turn on at time 388. This can cause the intermediate node "com" to drop by the difference between BLK and DEV (about ΔV2) during the developing phase of the sensing operation. This drop in the voltage on the intermediate node "com" can be capacitively coupled to the BLC signal line, and can also cause channel length modulation of the transistor configured as the bit line clamp, introducing noise in the bit line voltage $V_{BL}$. In a sensing operation in which there are many "fast" cells, this noise can be significant. This noise during the developing phase of the sensing operation, can interfere with the voltage $V_{BL}$ which should remain stable across the entire page to maintain safe read margins.

Technology described herein, including the 3T sense modules, can reduce noise arising as a result of these phenomena.

Figures 4A, 4B:
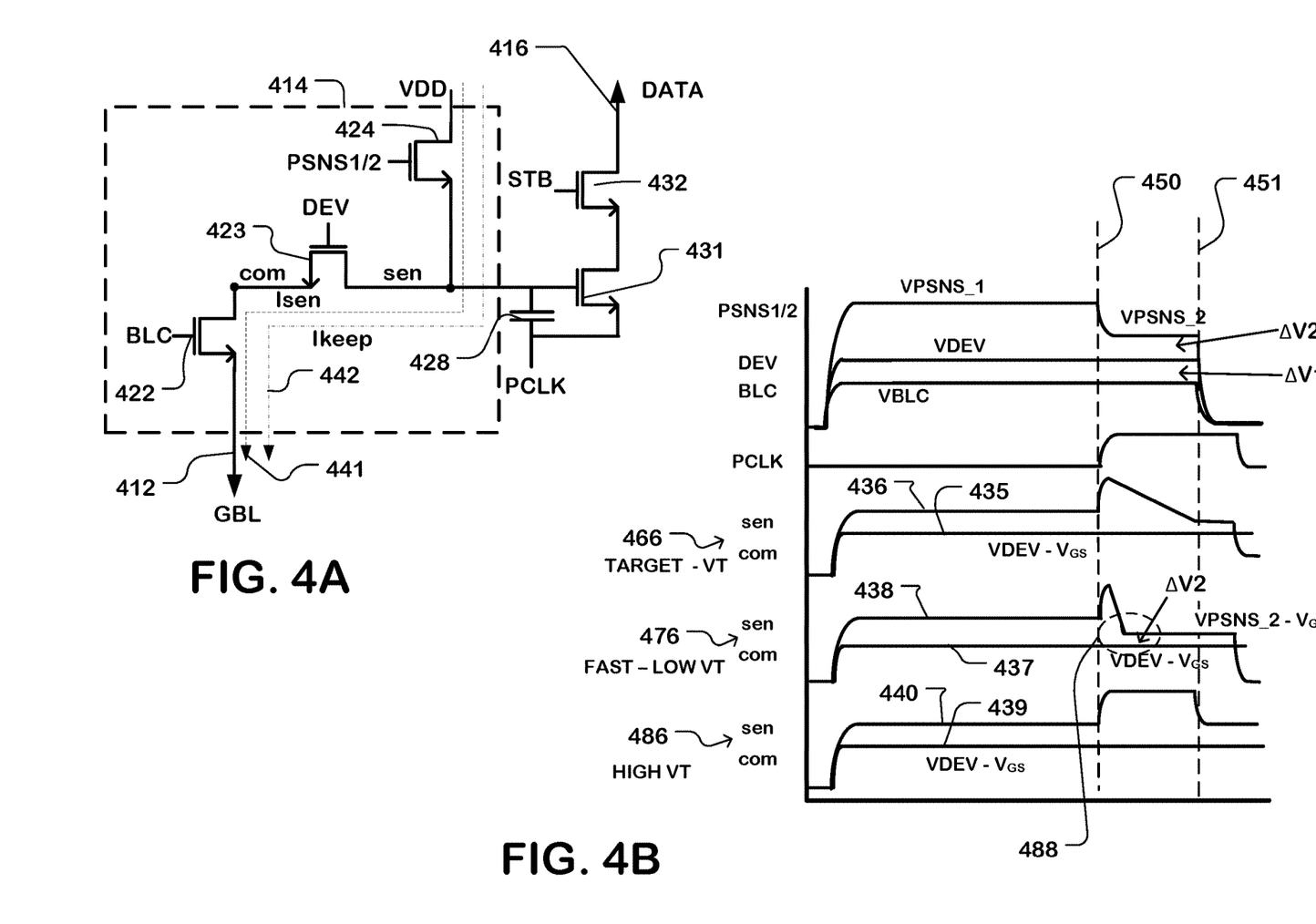
FIGS. 4A and 4B illustrate a low-noise bit line circuit and timing diagram according to technology described herein.

FIG. 4A illustrates a sense module including a low-noise bit line circuit according to one embodiment of the technology described herein, suitable for use in the system of FIG. 2. The low-noise bit line circuit has in input node coupled to a bit line 412 (via a data line in some examples) and provides output data DATA 416.

The low-noise bit line circuit includes a three-transistor sense module 414 and an output module comprising fourth transistor 431 and fifth transistor 432, in this example.

In the sense module 414, a first transistor 422 has a gate connected to the BLC signal, a source/drain terminal connected to the input node and bit line 412, and a source/drain terminal connected to an intermediate node "com". This first transistor 422 is configured as a bit line clamp transistor. A second transistor 423 has a source/drain terminal connected to the intermediate node "com", and a source/drain terminal connected to the sensing node "sen". A gate of the second transistor 423 is connected to the control signal DEV. A third transistor 424 has a gate connected to the control signal PSNS1/2, a first source/drain terminal connected to the sensing node "sen", and a second source/drain terminal connected either directly or through intervening circuits to a supply terminal VDD.

The control signal PCLK is capacitively coupled to the sensing node "sen" via capacitor 428 in this example.

An output circuit includes a fourth transistor 431 and a fifth transistor 432. The fourth transistor 431 has its gate connected to the sensing node "sen", a first source/drain terminal connected to the PCLK signal, and a second source/drain terminal. The fifth transistor 432 in the output circuit has a first source/drain terminal connected to the second source/drain terminal of the fourth transistor 431, and its gate connected to the control signal STB. The second source/drain terminal of the fifth transistor 432 supplies a data signal DATA as output. This DATA signal can be supplied to a latch or flip-flop in the page buffer configured to store the sensed data.

The BLC signal is applied to the gates of transistors (first transistor 422) in a plurality of sense modules. The transistors (e.g. 342) are configured as bit line clamps to hold the bit line voltage $V_{BL}$ during a sensing operation. This BLC signal can be shared on a common conductor to a large number of bit line clamp transistors.

The sense module 414 is configured to generate a sensing current Isen 441 used to maintain the first transistor 422 in a bit line clamping mode to establish a bit line voltage $V_{BL}$ for the sensing operation, and to charge the bit line and sensing node. Also, the sense module 414 is configured to generate a keeping current Ikeep 442 which prevents the bit line voltage from fluctuating during the sensing in circumstances described below.

The sense module 414 includes three transistors in series between the bit line and a supply terminal, acting as a load on the bit line during a sensing operation.

The first transistor is configured as a bit line clamp transistor, connected between a bit line and an intermediate node "com". The second transistor is configured as a transfer transistor, connected between the intermediate node and a sensing node "sen". The third transistor is configured as a current source or pre-charging transistor, connected between the sensing node and a supply terminal. An output circuit is coupled to the sensing node, in a manner that draws minimal or no current, such as by having a connection to a gate terminal of a transistor as illustrated in this example.

The sensing node voltage varies over a relatively wide range during a sensing operation, such as variations illustrated in FIG. 4B below. Also, the variation in voltage on the sensing node depends on the current magnitude drawn by the selected memory cell.

Control voltages are applied to the bit line clamp transistor, the transfer transistor, and the current source transistor in a manner that maintains the clamping operation of the bit line clamp transistor, and avoids fluctuation of the voltage on the intermediate node to reduce noise.

In operation, the voltage on the gate of the bit line clamp transistor and the voltage on the gate of the transfer transistor are held constant during the developing phase of the sensing operation during which the voltage on the sensing node changes according to the memory state being sensed. During this phase, the pre-charge transistor turns off, and current sufficient to maintain the bit line clamping operation is provided by the capacitance of the sensing node. When the sensing node falls to a discharge level just above the voltage on the gate of the transfer transistor, the pre-charge transistor clamps the voltage drop to a fixed voltage difference (e.g. $V_{GS}$) below its gate voltage and maintains a keeping current without causing fluctuation of the voltage on the intermediate node.

FIG. 4B is a timing diagram referred to, for description of a sensing operation for a low-noise bit line circuit like that of FIG. 4A. The sensing operation includes a pre-charge interval (before time 450) and a developing phase (between time 450 and time 451). At or near the end of the developing phase, the STB signal is asserted (not shown) to output the data.

In the timing diagram, voltages for the control signals PCLK, BLC, DEV and PSNS1/2 in the circuit of FIG. 4A are illustrated. At the beginning of the pre-charge interval, the BLC, DEV and PSNS1/2 signals are moved to operating levels. BLC is set at a voltage that will clamp the bit line voltage VBL at a level of about BLC–$V_{GS}$. DEV is set at a voltage ΔV1 above BLC, sufficient to maintain the intermediate node "com" at a level above BLC. PSNS1/2 is set at a level VPSNS_1 that determines the pre-charge voltage of the sensing node, and can pass current (Isen) to the bit line sufficient to maintain the clamping operation of the first transistor 422.

The PCLK signal is pulsed at the beginning of the developing phase, at or about the same time that the PSNS1/2 signal is dropped to a level VPSNS_2, which is about ΔV2 above the DEV voltage. The drop in PSNS1/2 results in turning off the third transistor 424, and isolating the sensing node. The boosting of PCLK causes capacitive boosting of the sensing node at the beginning of the developing phase as illustrated.

In the timing diagram, there are three versions illustrated for the voltages at the sensing node, and at the intermediate node "com". The uppermost version 466, including traces 435, 436, represents the voltages when sensing a low threshold memory cell having a threshold within a narrow range of the target threshold voltage $V_T$.

The middle timing diagram version 476, including traces 437, 438, represents the voltages when sensing a low threshold memory cell having a threshold causing it to operate as a "fast" cell, where the threshold may be lower than the preferred target $V_T$.

The lower version 486, including traces 439, 440, represents voltages when sensing a high threshold memory cell, where the threshold may be higher than the preferred target $V_T$.

At the beginning of the discharge interval, when the word line voltage is applied to the selected word line and memory cells, the PSNS1/2 signal is dropped to a keeping voltage level VPSNS_2, while the other control voltages BLC and DEV are held constant. VPSNS_2 has a voltage level that is about VDEV+ΔV2. As a result of the fall of the PSNS1/2 signal below the sensing node voltage, the third transistor 424 turns off, isolating the sensing node. At that time, the PCLK signal seen on trace 452 is pulsed, which boosts the sensing node by capacitive coupling. This boosting occurs at about time 450 in all three versions (uppermost) 466, (middle) 476, (lower) 486. Thereafter, the selected memory cell either discharges the sensing node as seen in uppermost version 466, or does not discharge the sensing node as seen in lower version 486.

When the STB signal is asserted at or about the end of the discharge interval, the fifth transistor 432 is either on (no discharge of the sensing node), or off (sensing node discharged), thereby generating a data signal and transferring the data signal out of the bit line circuit.

For uppermost version 466, in which the selected memory cell has a low threshold within a narrow range of the target, the voltage on the sensing node drops relatively gradually until the end of the developing phase at about time 451.

For lower version 486, in which the selected memory cell has a high threshold, the voltage on the sensing node is not discharged, and remains constant. In this situation, transistor 424 is turned off.

When the selected memory cell is a fast cell, such as in middle version 476, the sensing node can be discharged rapidly. This can result in the sensing node voltage on trace 438 falling to or below a discharge level voltage VPSNS2–$V_{GS}$, at which point third transistor 424 clamps the voltage drop and provides the current Ikeep 442. Because the transition at region 488 shown in the middle version 476, does not drop below the voltage at the intermediate node "com", and stays about ΔV2 above it in this example, the voltage on the intermediate node "com" does not fluctuate. This occurs because second transistor 423 turns on with sufficient keeping current to maintain the intermediate node "com" along with the bit line voltage $V_{BL}$, constant.

The method of operating the memory can be understood with reference to the timing diagram in FIG. 4B. This timing diagram will be modified according to the particular implementations of the bit line circuits. Generally, FIG. 4B illustrates an embodiment including (1) during a first phase to apply a bit line clamp voltage to a first transistor 422 (e.g. bit line clamp transistor), a transfer voltage to the second transistor (e.g. transistor 423) and a third voltage to the third transistor (e.g. transistor 424) to charge the sensing node (sen); and (2) during a second phase to boost the sensing node to a boosted voltage in a boosting stage, to adjust the third voltage applied to the third transistor to a keeping level, wherein the keeping level causes the third transistor to clamp the voltage level at the sensing node at a fixed voltage difference (e.g. $V_{GS}$) between the keeping level and the voltage level at the sensing node after discharge in the boosting stage (e.g. as a result of clamping by the third transistor 424). The fixed voltage difference ($V_{GS}$) equals to the threshold voltage of third transistor 424. If the voltage level at the sensing node falls below VPSNA_2–$V_{GS}$, the keeping current will be continuously generated in a clamping feedback action to rapidly compensate, maintaining VPSNS_2–$V_{GS}$ level at the sensing node.

In general FIG. 4B shows an embodiment including (1) during a first phase (e.g. pre-charge phase), applying a bit line clamp voltage to the bit line clamp transistor, a transfer voltage to the transfer transistor and a third voltage to the current source transistor to charge the sensing node; (2) during a second phase (e.g. developing phase), boosting the sensing node to a boosted voltage, adjusting the third voltage applied to the current source transistor to a keeping level, while a read voltage is applied to a selected memory cell on the bit line to discharge the sensing node toward a discharge level and level corresponding to a sensed memory state, the keeping level being below the boosted voltage by an amount to turn off the third transistor while the sensing node remains above the discharge level, and to cause the third transistor to turn on and apply a keeping current after the sensing node reaches the discharge level, and (3) during a third phase, generating the data signal based on a voltage on the sensing node after the second phase. This third phase can occur in a time window before dropping the transfer voltage to turn off the transfer transistor, overlapping with the developing phase of FIG. 4B.

Figures 5A, 5B:
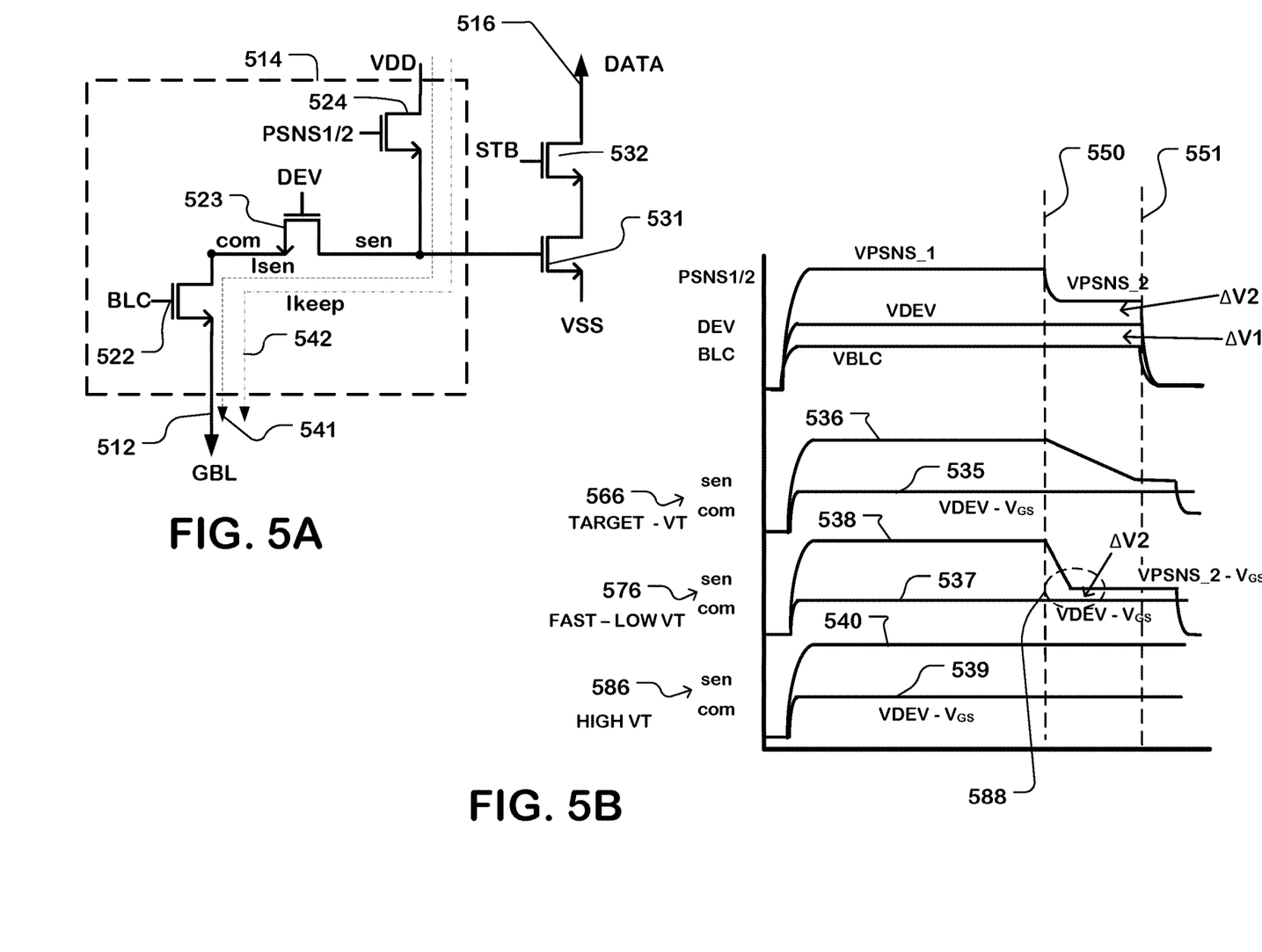
FIGS. 5A and 5B illustrate an alternative low-noise bit line circuit and timing diagram according to technology described herein.

FIG. 5A illustrates a sense module including a low-noise bit line circuit according to one embodiment of the technology described herein, suitable for use in the system of FIG. 2. The low-noise bit line circuit has an input node coupled to a bit line 512 (via a data line in some examples) and provides output data DATA 516.

The low-noise bit line circuit includes a three-transistor sense module 514 and an output module comprising fourth transistor 531 and fifth transistor 532, in this example.

In the sense module 514, a first transistor 522 has a gate connected to the BLC signal, a source/drain terminal connected to the input node and bit line 512, and a source/drain terminal connected to an intermediate node "com". This first transistor 522 is configured as a bit line clamp transistor. A second transistor 523 has a source/drain terminal connected to the intermediate node "com", and a source/drain terminal connected to the sensing node "sen". A gate of the second transistor 523 is connected to the control signal DEV. A third transistor 524 has a gate connected to the control signal PSNS1/2, a first source/drain terminal connected to the sensing node "sen", and a second source/drain terminal connected either directly or through intervening circuits to a supply terminal VDD.

An output circuit includes a fourth transistor 531 and a fifth transistor 532. The fourth transistor 531 has its gate connected to the sensing node "sen", a first source/drain terminal connected to the VSS signal, and a second source/drain terminal. The fifth transistor 532 in the output circuit has a first source/drain terminal connected to the second source/drain terminal of the fourth transistor 531, and its gate connected to the control signal STB. The second source/drain terminal of the fifth transistor 532 supplies a data signal DATA as output. This DATA signal can be supplied to a latch or flip-flop in the page buffer configured to store the sensed data.

The BLC signal is applied to the gates of transistors (first transistor 522) in a plurality of sense modules. The transistors (e.g. 522) are configured as bit line clamps to hold the bit line voltage $V_{BL}$ during a sensing operation. This BLC signal can be shared on a common conductor to a large number of bit line clamp transistors.

The sense module 514 is configured to generate a sensing current Isen 541 used to maintain the first transistor 522 in a bit line clamping mode to establish a bit line voltage $V_{BL}$ for the sensing operation, and to charge the bit line and sensing node. Also, the sense module 514 is configured to generate a keeping current Ikeep 542 which prevents the bit line voltage from fluctuating during the sensing in circumstances described below.

The sense module 514 includes three transistors in series between the bit line and a supply terminal, acting as a load on the bit line during a sensing operation.

The first transistor is configured as a bit line clamp transistor, connected between a bit line and an intermediate node "com". The second transistor is configured as a transfer transistor, connected between the intermediate node and a sensing node "sen". The third transistor is configured as a current source or pre-charging transistor, connected between the sensing node and a supply terminal. An output circuit is coupled to the sensing node, in a manner that draws minimal or no current, such as by having a connection to a gate terminal of a transistor as illustrated in this example.

The sensing node voltage varies over a relatively wide range during a sensing operation, such as variations illustrated in FIG. 5B below. Also, the variation in voltage on the sensing node depends on the current magnitude drawn by the selected memory cell.

Control voltages are applied to the bit line clamp transistor, the transfer transistor, and the current source transistor in a manner that maintains the clamping operation of the bit line clamp transistor, and avoids fluctuation of the voltage on the intermediate node to reduce noise.

In operation, the voltage on the gate of the bit line clamp transistor and the voltage on the gate of the transfer transistor are held constant during the developing phase of the sensing operation during which the voltage on the sensing node changes according to the memory state being sensed. During this phase, the pre-charge transistor turns off, and current sufficient to maintain the bit line clamping operation is provided by the capacitance of the sensing node. When the sensing node falls to a discharge level just above the voltage on the gate of the transfer transistor, the pre-charge transistor clamps the voltage drop to a fixed voltage difference (e.g. $V_{GS}$) below its gate voltage and maintains a keeping current without causing fluctuation of the voltage on the intermediate node.

FIG. 5B is a timing diagram referred to, for description of a sensing operation for a low-noise bit line circuit like that of FIG. 5A. The sensing operation includes a pre-charge interval (before time 550) and a developing phase (between time 550 and time 551). At or near the end of the developing phase, the STB signal is asserted (not shown) to output the data.

In the timing diagram, voltages for the control signals BLC, DEV and PSNS1/2 in the circuit of FIG. 5A are illustrated. At the beginning of the pre-charge interval, the BLC, DEV and PSNS1/2 signals are moved to operating levels. BLC is set at a voltage that will clamp the bit line voltage VBL at a level of about BLC–$V_{GS}$. DEV is set at a voltage ΔV1 above BLC, sufficient to maintain the intermediate node "com" at a level above BLC. PSNS1/2 is set at a level VPSNS_1 that determines the pre-charge voltage of the sensing node, and can pass current (Isen) to the bit line sufficient to maintain the clamping operation of the first transistor 522.

In contrast to the embodiment of FIG. 4-4A, in which the PCLK signal is pulsed at the beginning of the developing phase to boost the "sen" node, in the embodiment of FIG. 5-5A, the PSNS1/2 signal is set VPSNS_1 having a level sufficiently high that no boosting is needed. Rather, the level of the "sen" node is held until time 550 when the PSNS1/2 signal is dropped to a level VPSNS_2, which is about ΔV2 above the DEV voltage. The drop in PSNS1/2 results in turning off the third transistor 524, and isolating the sensing node.

In the timing diagram, there are three versions illustrated for the voltages at the sensing node, and at the intermediate node "com". The uppermost version 566, including traces 535, 536, represents the voltages when sensing a low threshold memory cell having a threshold within a narrow range of the target threshold voltage $V_T$.

The middle timing diagram version 576, including traces 537, 538, represents the voltages when sensing a low threshold memory cell having a threshold causing it to operate as a "fast" cell, where the threshold may be lower than the preferred target $V_T$.

The lower version 586, including traces 539, 540, represents voltages when sensing a high threshold memory cell, where the threshold may be higher than the preferred target $V_T$.

At the beginning of the discharge interval, when the word line voltage is applied to the selected word line and memory cells, the PSNS1/2 signal is dropped to a keeping voltage level VPSNS_2, while the other control voltages BLC and DEV are held constant. VPSNS_2 has a voltage level that is about $V_{DEV}+\Delta V2$. As a result of the fall of the PSNS1/2 signal below the sensing node voltage, the third transistor 524 turns off, isolating the sensing node. Thereafter, the selected memory cell either discharges the sensing node as seen in uppermost version 566, or does not discharge the sensing node as seen in lower version 586.

When the STB signal is asserted at or about the end of the discharge interval, the fifth transistor 532 is either on (no discharge of the sensing node), or off (sensing node discharged), thereby generating a data signal and transferring the data signal out of the bit line circuit.

For uppermost version 566, in which the selected memory cell has a low threshold within a narrow range of the target, the voltage on the sensing node drops relatively gradually until the end of the developing phase at about time 551.

For lower version 586, in which the selected memory cell has a high threshold, the voltage on the sensing node is not discharged, and remains constant. In this situation, transistor 524 is turned off.

When the selected memory cell is a fast cell, such as in middle version 576, the sensing node can be discharged rapidly. This can result in the sensing node voltage on trace 538 falling to or below a discharge level voltage VPSNS2−$V_{GS}$, at which point third transistor 524 clamps the voltage drop and provides the current Ikeep 542. Because the transition at region 588 shown in the middle version 576, does not drop below the voltage at the intermediate node "com", and stays about $\Delta V2$ above it in this example, the voltage on the intermediate node "com" does not fluctuate. This occurs because second transistor 523 turns on with sufficient keeping current to maintain the intermediate node "com" along with the bit line voltage $V_{BL}$, constant.

The method of operating the memory can be understood with reference to the timing diagram in FIG. 5B. This timing diagram will be modified according to the particular implementations of the bit line circuits. Generally, FIG. 5B illustrates an embodiment including (1) during a first phase to apply a bit line clamp voltage to a first transistor 522 (e.g. bit line clamp transistor), a transfer voltage to the second transistor (e.g. transistor 523) and a third voltage to the third transistor (e.g. transistor 524) to charge the sensing node (sen); and (2) during a second phase hold the sensing node while adjusting the third voltage applied to the third transistor to a keeping level, wherein the keeping level causes the third transistor to clamp the voltage level at the sensing node at a fixed voltage difference (e.g. $V_{GS}$) between the keeping level and the voltage level at the sensing node after discharge (e.g. as a result of clamping by the third transistor 524). The fixed voltage difference ($V_{GS}$) equals to the threshold voltage of third transistor 524. If the voltage level at the sensing node falls below VPSNA_2−$V_{GS}$, the keeping current will be continuously generated in a clamping feedback action to rapidly compensate, maintaining VPSNS_2−$V_{GS}$ level at the sensing node.

In general FIG. 5B shows an embodiment including (1) during a first phase (e.g. pre-charge phase), applying a bit line clamp voltage to the bit line clamp transistor, a transfer voltage to the transfer transistor and a third voltage to the current source transistor to charge the sensing node; (2) during a second phase (e.g. developing phase), adjusting the third voltage applied to the current source transistor to a keeping level, while a read voltage is applied to a selected memory cell on the bit line to discharge the sensing node toward a discharge level and level corresponding to a sensed memory state, the keeping level being below the boosted voltage by an amount to turn off the third transistor while the sensing node remains above the discharge level, and to cause the third transistor to turn on and apply a keeping current after the sensing node reaches the discharge level, and (3) during a third phase, generating the data signal based on a voltage on the sensing node after the second phase. This third phase can occur in a time window before dropping the transfer voltage to turn off the transfer transistor, overlapping with the developing phase of FIG. 5B.

Figure 6:
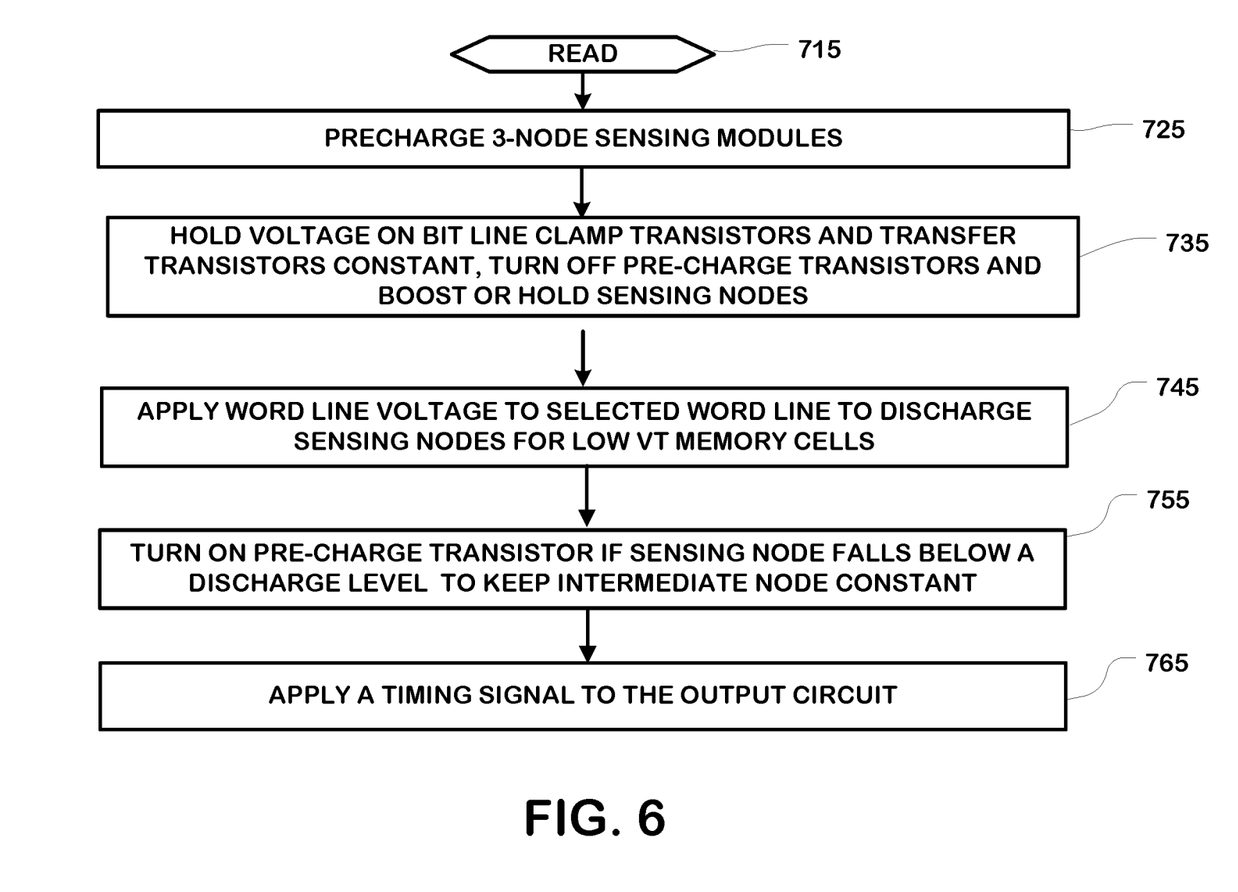
FIG. 6 is a flowchart illustrating a method for operating a memory device comprising an array of memory cells, and includes the sensing sequence, according to one implementation of the technology disclosed.

FIG. 6 is a flowchart of a generalized method of operating a memory device for a sensing operation, having a sense module that includes three nodes which can be implemented with three transistors in series, in some embodiments (though additional transistors or other circuit elements may be used in some embodiments). The three nodes include an input node in or configured for current flow communication with a bit line, an intermediate node and a sensing node. An output module is coupled to the sensing node to provide the read data.

The method executes in response to a command or other state requiring a sensing operation (715). This sensing operation can be executed in response to a read command, or as part of a program or erase verify operation, for example, used in some types of memory such as flash memory.

The method includes pre-charging the three-node sense modules for a plurality of bit lines (725). In the example illustrated, this includes applying a bit line clamp voltage to a bit line clamp transistor between the input node and the intermediate node, a transfer voltage to a transfer transistor between the intermediate node and the sensing node, and a pre-charge voltage to a pre-charge transistor between the sensing node and a supply terminal.

After pre-charging, the voltages on the bit line clamp transistors and the transfer transistors are held constant, to hold the input nodes and intermediate nodes at constant levels, while the pre-charge transistors are turned off by dropping the gate voltage to a clamp level and optionally boosting (e.g. as in using PCLK in FIG. 4-4a) or holding (e.g. as in FIGS. 5-5A) the sensing nodes (735).

A word line voltage is applied to a selected word line to discharge the sensing nodes for low threshold memory cells (745). If the memory cell on a selected bit line does not have a low threshold, then the sensing node voltage is not discharged.

The method includes turning on the pre-charge transistor in a clamping mode if the corresponding sensing node falls to a discharge level in order to keep the intermediate node voltage constant and maintain the bit line clamping operation of the bit line clamp transistor (755). Also, at a predetermined time after application of the word line voltage, a timing signal is applied to generate a data signal and transfer the sensed data signal to a page buffer latch or other output (765).

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory device including a plurality of bit line circuits, each bit line circuit having a sense module that includes an input node in current communication with a bit line, a bit line clamp transistor, an intermediate node, a transfer transistor and a sensing node in series, and an output module coupled to the sensing node to provide read data, comprising:
pre-charging the input nodes, the intermediate nodes and sensing nodes of sense modules for a plurality of bit lines;
after pre-charging, holding the voltage on the bit line clamp transistors and the transfer transistors constant, to hold the input nodes and intermediate nodes at constant levels, while turning off pre-charge transistors;
applying a word line voltage to a selected word line to discharge the sensing nodes for low threshold memory cells;
turning on the pre-charge transistors in sense modules in which the corresponding sensing node falls below a discharge level in order to keep the intermediate node voltage constant and maintain the bit line clamping operation of the bit line clamp transistor; and
at a predetermined time after application of the word line voltage, transferring the sensed data as a function of voltage on the sensing node to an output.

2. The method of claim 1, wherein the device includes a capacitor having one terminal at the sensing node, and including boosting the sensing node to a boosted voltage before discharging the sensing nodes by applying a pulse to a second terminal of the capacitor.

3. The method of claim 1, wherein the pre-charge transistors are in corresponding sense modules of the bit line circuit, where the pre-charge transistor in each module is connected between the sensing node and a supply terminal, and said pre-charging the sensing nodes includes applying a gate voltage having a first voltage level to the pre-charge transistor to set a pre-charge level on the sensing node.

4. The method of claim 3, wherein said turning off the pre-charge transistors includes reducing a gate voltage on the pre-charge transistor to a second voltage level, less than a threshold voltage above the pre-charge level on the sensing node.

5. The method of claim 4, wherein said turning on the pre-charge transistors includes holding the gate voltage on the pre-charge transistor at the second voltage level, after the sensing node falls to the discharge level more than the threshold voltage below the second voltage level.

6. The method of claim 5, including boosting the sensing nodes above the pre-charge level before discharging the sensing nodes.

7. A method of operating a memory device including a plurality of bit line circuits, each bit line circuit having a sense module that includes an input node in current communication with a bit line, a bit line clamp transistor, an intermediate node, a transfer transistor and a sensing node in series, a pre-charge transistor connected between the sensing nodes and a supply voltage, and an output module coupled to the sensing node to provide read data, comprising:
pre-charging the input nodes, the intermediate nodes and sensing nodes of sense modules for a plurality of bit lines, including applying a gate voltage to the pre-charge transistors having a first voltage level;
after pre-charging, holding the voltage on the bit line clamp transistors and the transfer transistors constant, to hold the input nodes and intermediate nodes at constant levels;
lowering the gate voltages on the pre-charge transistors to a second voltage level;
applying a word line voltage to a selected word line to discharge the sensing nodes for low threshold memory cells;
turning on the pre-charge transistors in sense modules in which the corresponding sensing node falls more than a threshold voltage below the second voltage level in order to keep the intermediate node voltage constant and maintain the bit line clamping operation of the bit line clamp transistor; and
at a predetermined time after application of the word line voltage, transferring the sensed data as a function of voltage on the sensing node to an output.

8. The method of claim 7, including boosting the sensing nodes to a boosted voltage level before applying the word line voltage.

* * * * *